United States Patent [19] [11] 3,776,736
Davidson [45] Dec. 4, 1973

[54] STABILIZED PHOTORESIST COMPOSITION

[75] Inventor: Edmund Benjamin Davidson, Yardley, Pa.

[73] Assignee: RCA Corporation, New York, N.Y.

[22] Filed: Aug. 7, 1972

[21] Appl. No.: 278,265

[52] U.S. Cl. .................. 96/115 R, 96/35.1, 96/36.2, 96/91 N, 204/159.18, 204/159.19
[51] Int. Cl. .............................................. G03c 1/68
[58] Field of Search ............ 96/115 R, 91 N, 115 P; 204/159.18, 159.19

[56] References Cited

UNITED STATES PATENTS

| | | | |
|---|---|---|---|
| 3,615,952 | 10/1971 | Davidson | 156/13 |
| 3,732,097 | 5/1973 | Dickie et al. | 96/35.1 |

*Primary Examiner*—Ronald H. Smith
*Attorney*—Glenn H. Bruestle et al.

[57] ABSTRACT

A photoresist composition comprising an air-drying alkyd resin, a photosensitizer, and a stabilizer consisting of methylthio-m-cresol or methylthio phenol.

4 Claims, No Drawings

STABILIZED PHOTORESIST COMPOSITION

BACKGROUND

Photoresists are substances that are resistant to the action of certain solvents and are also light-sensitive in that exposure to some form of actinic radiation causes them to at least partially change chemically from one to the other of two alternative forms, one of which is resistant to certain solvents and the other of which is soluble in those solvents.

Most photoresists change from a soluble to an insoluble form when they are exposed to light. These are known as "negative" photoresists because, just as for a silver halide emulsion, the areas of photoresist remaining after development of an image are those that have been exposed to light.

A negative type photoresist that has been found particularly useful in manufacturing integrated electronic circuits because of its excellent adherence to silicon dioxide films and also to metals such as tungsten, chromium and gold, is one made from an oil-modified alkyd resin as described in U.S. Pat. No. 3,615,952 issued Oct. 26, 1971 to Edmund B. Davidson. This material has the disadvantage, however, of crosslinking when a film of the resist is allowed to stand, even at room temperature, for a number of hours. Premature crosslinking of the photoresist film (also called fogging) on a silicon wafer coated with a silicon dioxide under layer and a resist top layer often results in imperfect removal of the photoresist by the developer in "opened" areas and subsequent poor etching of the silicon dioxide film to form the desired pattern of oxide.

Under actual factory conditions, it is sometimes necessary to hold photoresist-coated wafers as long as 16 hours before the wafers are exposed and the photoresist developed. A photoresist of the above described type is therefore not suitable for all types of factory operations since it may "fog" before it is used. It is therefore desirable to find a way to stabilize this photoresist composition so that resist-coated parts can be stored longer without fogging but the stabilization will not interfere with the normal crosslinking which the resin must undergo if it is to act properly as a photosensitive material.

DESCRIPTION OF PREFERRED EMBODIMENT OF THE INVENTION

The present invention is a composition of matter which is a photoresist comprising an air-drying alkyd resin and including methylthio-m-cresol or methylthio phenol as a stabilizer.

EXAMPLE

In making the resist, an oil-modified alkyd resin as one example of a suitable alkyd resin) is prepared by reacting together:

| | |
|---|---|
| Tall oil fatty acid (1% resin) | 25.0% by weight |
| Phthalic anhydride | 35.5% by weight |
| Pentaerythritol | 18.0% by weight |
| Trimethylol propane | 16.9% by weight |
| Benzoic acid | 4.6% by weight |

The ingredients are reacted at a temperature of about 200° C until the product has an acid number of about 5–25.

The alkyd resin thus prepared in an amount of, for example, 225 gms. is heated with stirring to 200° C for 1 hour under nitrogen, then cooled to 100° C. Methylcyclohexane in an amount of 900 ml. is added and the mixture is heated to reflux with stirring. After 1 hour, heating and stirring are discontinued and the supernatant liquid is decanted. The remaining imbibed solvent is removed by distillation, after which the recovered polymer, approximately 185 gms. is dissolved in the desired solvent, decanted and filtered.

The above-described treatment is for the purpose of removing the low-molecular weight ends of the alkyd resin. Preferably, about 15–40 percent of the original material should be removed.

To make up a photoresist material, the modified alkyd resin is dissolved in toluene or a mixture of toluene and xylene to make up a solution of about 20 percent solids. A sensitizer is then added to an amount of about 6 wt. percent of the resin. The sensitizer may be, for example, 2,6-bis (para-azidobenzylidene)-4-methylcyclohexanone. Other suitable sensitizers are: benzoin, benzophenone, 2,3-butanedione, 4,4,4',4'-bis-(dimethylamino) benzophenone, benzoin methyl ether, 2-methylantra-quinone. Mixtures of these may also be used. In general, the amount of sensitizer may be from about 1% to about 15% by weight of the resin.

To this solution is added an amount of methylthio-m-cresol in the amount of about 10% by weight of the sensitizer. Wafers coated with the photoresist material can stand for as long as 24 hours before they are exposed and developed.

Amounts of the stabilizer as low as 1% by weight of the sensitizer will produce noticable improvement in the storage life of a photoresist film. Amounts up to about 15% by weight of the sensitizer increase the storage life of the film without adversely affecting the exposure requirements. Too much of the stabilizer slows down the exposure action too much for most ordinary commercial applications.

A chemically related material that can be used instead of the methylthio-m-cresol is methylthio phenol. It is used in proportions similar to the cresol derivative. However, its stabilizing properties are not quite as good as those of the cresol derivative.

These compositions can be used as etch resists as follows. A solution of the resist, prepared as above described, is spin coated, e.g. on an oxide-coated silicon wafer having a coating of silicon dioxide, at a speed of 7,000 r.p.m. After drying, an exposure is made through a photographic negative to a collimated light source utilizing a 200 watt high-pressure mercury lamp for 10–15 seconds.

The exposed layer is developed in butyl acetate to dissolve the nonexposed photoresist, and rinsed in a 1:1 solution of isopropyl alcohol and methyl cyclohexanone. The wafer is then baked 5–10 minutes at 200° C. and is ready for etching the exposed silicon oxide regions.

Etching is carried out using a conventional etching solution of hydrofluoric acid buffered with ammonium fluoride.

I claim:

1. A photoresist composition comprising (i) an air-drying alkyd resin, (ii) a photosensitizer for said resin, (iii) a solvent for said resin and (iiii) a stabilizer which is either methylthio-m-cresol or methylthio phenol in an amount of from about 1% to about 15% by weight of said photosensitizer.

2. A photoresist composition according to claim 1 in which said stabilizer is methylthio-m-cresol.

3. A photoresist composition according to claim 2 in which the amount of said stabilizer is 10% by weight of said photosensitizer.

4. A photoresist composition according to claim 1 in which said stabilizer is methylthio phenol.

* * * * *